April 8, 1969 G. M. SMITH 3,438,024

CONTROLLED BIAS FEEDBACK ANALOG TO DIGITAL CONVERTER

Filed June 24, 1965

INVENTOR
GEORGE MITCHELL SMITH
BY
[signature]
ATTORNEYS

United States Patent Office 3,438,024

Patented Apr. 8, 1969

3,438,024
CONTROLLED BIAS FEEDBACK ANALOG TO DIGITAL CONVERTER

George Mitchell Smith, Coventry, England, assignor to The General Electric Company Limited, London, England Filed June 24, 1965, Ser. No. 466,759
Claims priority, application Great Britain, June 26, 1964, 26,547/64
Int. Cl. G08c 9/04; H03f 1/36; H04l 3/00
U.S. Cl. 340—347 2 Claims

ABSTRACT OF THE DISCLOSURE

An analog to digital converter wherein a polarity detector has applied to it the analog signal, a controlled bias signal, and a signal variable in binary weighted steps, and comprising logic circuits responsive to polarity indications from the polarity detector to tend to reduce the signal sum to zero, the polarity indications constituting the digital output signal, the bias signal being automatically controlled to center the median of the analog signal within the range of voltages with which it is being compared.

Figure 1:
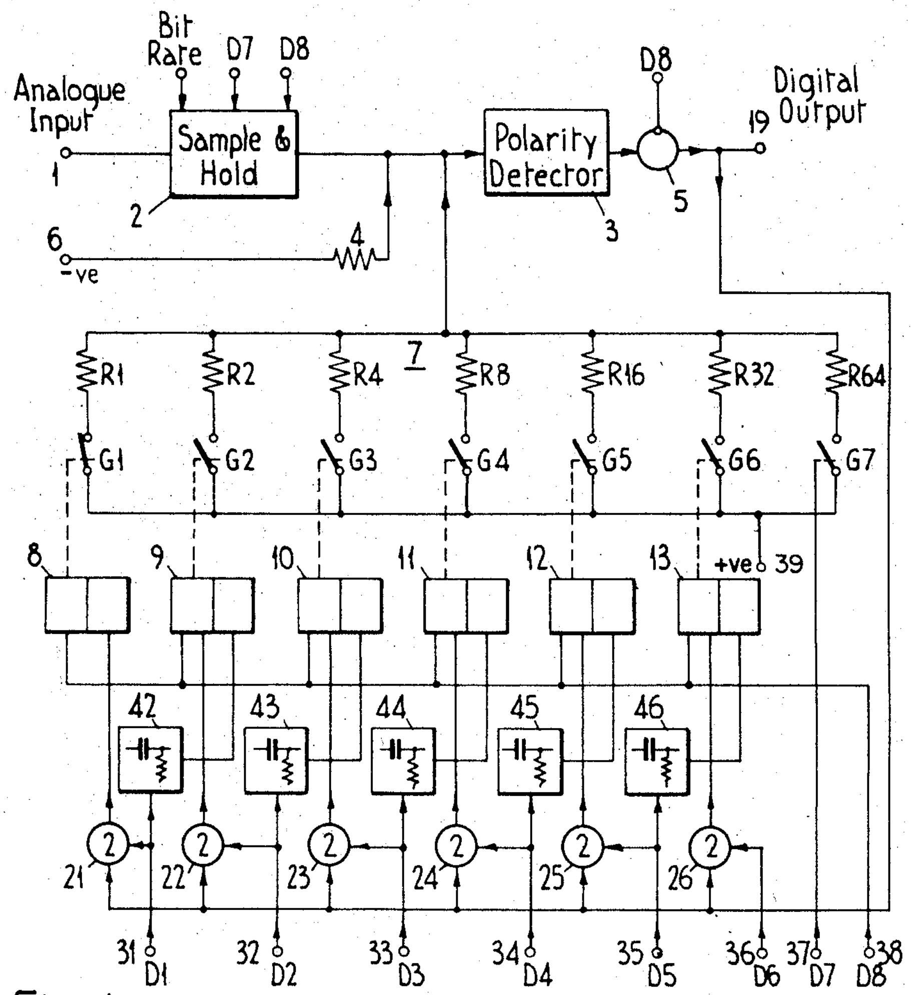

This invention relates to an analog to digital converter suitable for use for example, in connection with multichannel communication systems employing binary pulse-code modulation.

When coding an analog signal according to its signal level at intervals, it is desirable that the whole of the digital range provided by the encoding apparatus should be available for representation of the analog signal level. It is thus an object of the present invention to provide means for bringing into correspondence predetermined values of the analog and digital signal levels.

According to one aspect of the present invention, in an analog to digital converter of the kind in which, in each digital encoding operation a digital output signal is derived by sequentially comparing the instantaneous analog signal level with respective levels of a unidirectional signal that is variable in steps, successive increments of the variable signal being retained to provide the digital output signal or not so retained according to the result of the comparison, means are provided for supplying a bias signal in opposition to said variable signal so that the range of variation of the analog signal is aligned with the range of variation of said variable signal.

According to another aspect of the invention, in an analog to digital converter of the kind in which, in each encoding operation the analog signal level is sequentially compared with different levels of a quantised signal each comparison providing one digit of the required digital representation of the analog signal, means are provided to supply to the comparison circuit a bias signal of magnitude dependent upon the fraction of time, measured over a number of coding cycles, for which the quantised signal has a magnitude greater than a predetermined magnitude so that the converter automatically maintains a predetermined correspondence between the analog input signal and the quantised signal.

According to another aspect of the present invention, in an analog to digital converter of the kind in which, in each digital encoding operation a digital output signal is derived by sequentially comparing the instantaneous analog signal level with respective levels of a signal that is variable in steps, successive increments of the variable signal being retained to provide the digital output signal or not so retained according to the result of the comparison, bias means are provided for supplying a bias signal in opposition to said variable digital signal, the bias signal being dependent upon variable impedance means included in said bias means and controlled in accordance with the incidence of an excess of level, of said signal variable in steps, over a predetermined signal level, the arrangement being such that the range of variation of said signal variable in steps maintains a predetermined correspondence with the range of variation of the analog signal.

The magnitude of the bias signal may be arranged to be approximately half the maximum magnitude of the signal with which the analog signal is compared.

The variable impedance means may comprise the emitter-collector path of a transistor having emitter, collector and base electrodes, in series with a resistor.

Figure 2:
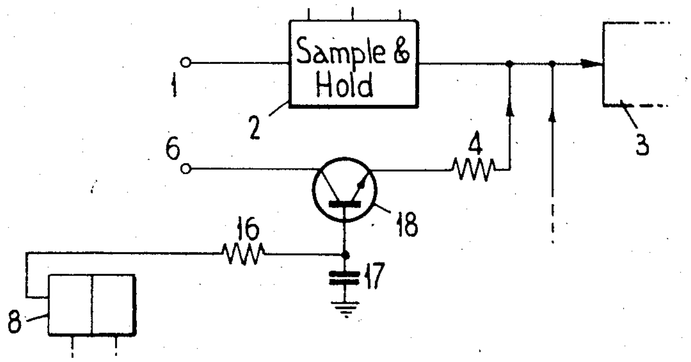

An analog to digital converter according to the present invention will now be described, by way of example with reference to FIGURES 1 and 2 of the accompanying drawing. FIGURE 1 is a diagrammatic circuit of an analog to digital converter as incorporated in a pulse-code-modulation (P.C.M.) communication transmitter and FIGURE 2 is part of a diagrammatic circuit showing a modification of FIGURE 1.

The converter is for use in a P.C.M. system for the transmission of twenty-four audio channels interlaced in time-division multiplex in the usual manner. The twenty-four audio signals are sampled sequentially, each sample having seven binary digits allocated for its coding. Each code group of seven digits is followed by a signalling digit, the eight digits constituting a channel group of which there are twenty-four in a frame, i.e., one cycle of the transmitted signal. Timing circuits in the transmitter supply timing pulses of digit, channel and frame frequency, and of these timing pulses those used in the present converter are: a "bit-rate" signal having a pulse repetition rate at the fundamental pulse repetition rate of the system; a digit-one (D1) pulse signal having a repetition rate equal to the channel frequency and of such phase that each pulse coincides with the first pulse of a channel group; and similar D2–D8 signals of corresponding phase.

Referring to FIGURE 1, the twenty-four audio signals are supplied to the terminal 1 in sequence. A "sample and hold" circuit 2 to which are supplied the bit-rate, D7 and D8 signals, is connected to the terminal 1 and is effective to sample each audio signal starting at digit-eight and maintain the sample throughout seven digit positions to be reset by the digit-seven signal. The sample circuit 2 is connected to a polarity detector circuit 3 to which it supplies a current, positive or negative, according to the level of the sample. Also supplied to the detector 3 are a bias signal from a negative source 6 by way of a resistor 4, a current variable in binary steps from a positive source 39 by way of a current-adding circuit 7, and two timing signals, the bit-rate signal and the digit-eight signal to enable the detector 3 to make successive polarity checks with a particular sample and to reset it after the final check has been made.

The output of the detector 3 is supplied by way of an inhibit gate 5 to a digital output terminal 19 for transmission through the system and also to a set of six AND-gates 21–26 for control of the current adding circuit. The inhibit gate 5 is supplied with digit-eight pulses so inhibiting any output during those pulses. The detector 3 effectively adds the opposing currents from the source 6 and circuit 7, together with the current from the sample circuit 2, and gives a pulse present or absent according to the polarity of the algebraic sum of the three currents. It will be seen that this output signal comprises, for each audio sample, a succession of seven digits each represented by a pulse present or absent, each pulse present representing the absence of the corresponding binary level from the sample in question.

The current adding circuit 7 comprises a bank of seven resistors R1, R2, R4 . . . R64 of graduated values corresponding to the respective suffixes and thus proportional to successive powers of two. Each resistor R is in series with a respective transistor gate G1–G7 which, when closed connects the particular resistor R between a source 39 and the detector 3 in parallel with any other resistors R whose gates are closed. The current drawn by the circuit 7 can thus be varied between 0 and a maximum value in 127 equal steps.

The gates G are shown symbolically as mechanical contacts but are in fact transistor stages each, except for gate G7, controlled by a respective one of six bistable circuits 8–13. Gate G7 is directly controlled by the digit-seven signal, being closed in the presence of a digit seven pulse and open otherwise. The bistable circuits 8–13 are each supplied with the digit-eight signal from terminal 38 this acting as a reset signal after each polarity check. The six bistable circuits 8–13 are coupled to their respective gates in identical manners but the reset connection to bistable 8 resets the opposite state from that in the other five cases so that after a reset pulse the gates G are as shown, G1 closed and the remainder open (G7 because of the absence of a D7 pulse). Resistor R1 is the most significant resistor so that after reset, i.e., just prior to a fresh polarity check the most significant current level of the current adding circuit is present.

The bistable circuits 8–13 are additionally controlled by the AND-gates 21–26 and by five differentiating circuits 42–46. The six AND-gates are connected to the bistable circuits 8–13 so that an output pulse from a particular AND-gate effects the open condition of the corresponding gate G. The five differentiating circuits 42–46 are effective when providing an output signal to set that state of the corresponding bistable 9–13 which closes the corresponding gate G2–G6. The five differentiating circuits 42–46 are supplied with the digit-one to digit-five signals respectively and are arranged so that the trailing edge of each pulse of each of these signals initiates an output from the corresponding differentiator. A digit-one pulse for example will cause the bistable circuit 9 to trip to that condition in which gate G2 is closed, and this at the trailing edge of the digit-one pulse.

The AND-gates 21–26 each have two input signals, one from the detector 3 output and one "selecting" signal, one of the digit signals, from the terminals 31–36. A particular AND-gate will, therefore, be enabled, and provide a pulse which opens the corresponding gate G1–G6, when the particular digit pulse is present at the same time as a pulse from the detector 3 (indicating the presence of too much current from the current adding circuit 7).

The detector 3 output pulses are therefore to this extent correcting pulses in trying to establish zero net current through the detector.

The operation is, then, as follows. During a digit 8 pulse the sample circuit 2 takes a fresh sample of the particular analog signal. During a digit-one pulse the detector 3 makes a polarity check involving the negative bias current, the positive circuit 7 current and the sample current. If the sum is negative no output pulse is supplied by the detector 3 and this pulse-absent is the first digit of the transmitted signal. The gate G1 will, as has been explained, have been closed during D1 and now with the absence of any detector pulse during that digit, gate 21 will make no correction by way of opening that gate G1. At the trailing edge of the D1 pulse however, differentiator 42 will trip bistable 9 and close gate G2 so that on the occurrence of D2 the circuit 7 current will be increased by the current carried by R2. During D2 a further polarity check will be made and the corresponding output from detector 3 will or will not enable gate 22 to trip bistable 9 back to the open condition of gate G2. The process can be seen to continue, there being a polarity check during each digit pulse the trailing edge of which closes the next gate G for the next check.

When six polarity checks have been made the digit-seven signal closes gate G7, the next check is made and a right or wrong indication appears in the output of detector 3. However if the closing of gate G7 was wrong no correction means such as another AND-gate 21–26 is needed for it drops out on removal of the D7 pulse and is of no further significance.

Without the bias source 6 and resistor 4 only negative analog currents (i.e., from a negative potential source with respect to earth) could be represented digitally with the arrangement shown. By selecting the value of the resistor 4 to be equal to R1, that is, the most significant resistor of the circuit 7, there is a substantially equal range of digital representation available above and below a value of zero analog input.

At zero analog input the digital coded output will therefore be registering at the centre of its range which in the present case of a "straight" binary code will be 1000000. If the analog signal is symmetrical about zero it will then be encoded symmetrically throughout its whole range. As, in the arrangement shown, the maximum balancing current from the circuit 7 will correspond to the most negative values of analog signal, means may be provided for reversing the digital indication, for example, by arranging that the "closed" condition of the gates G1–G7 corresponds to a "0" binary condition of the bistable circuits 8–14. However, such a complementing operation is unnecessary in the present case for without it, the signal when decoded will simply be of opposite phase, which is of no consequence with speech signals.

In the arrangement according to FIGURE 1, if there should be an instability in the supply voltages, change in component values due to temperature changes or zero drift of the input analog signal, there will not be complete symmetry of the digital representation about its range centre. The modification according to FIGURE 2 is designed to overcome such difficulties.

Referring now to FIGURE 2, a transistor 18 is included in the bias current path with resistor 4. The base electrode is connected to one side of a storage capacitor 17 and also to a resistor 16. The resistor 16 is connected to the bistable circuit 8 and the circuit is otherwise similar to FIGURE 1 and has the same references.

The capacitor 17 is charged through resistor 16 during the incidence of that condition of store 8 in which gate G1 is closed. The time constant of the R(16) C(17) circuit is chosen to be long compared to the sampling period so that the bias current controlled by the transistor 18 slowly follows any drift of the average incidence of the "close" condition of store 8. By controlling from store 8 rather than any other store and using a modified value of resistor 4 so that with zero analog signal the digital representation is still half its maximum value, the bias current will be controlled so that the average value of the analog signal corresponds to the centre of the digital range.

The advantage of this arrangement is that the components and supply voltages are not requierd to have such a high degree of stability compared to the requirements of the previous arrangement.

I claim:

1. An analog to digital converter comprising polarity detecting means, step variable signal supply means to supply a signal variable in binary weighted steps, bias signal supply means to supply a bias signal, said bias signal supply means including variable impedance means, the impedance of which determines the magnitude of said bias signal, the variable impedance means being controlled in dependence upon the incidence of the most significant step of said step variable signal, and analog input signal supply means to supply a sample of an analog input signal, the three signal supply means being connected to said polarity detecting means which provides an output signal in dependence upon the polarity of the sum of the three signals, means connected to said step variable signal supply means and controlled by polarity indications from said polarity detecting means to tend to reduce said sum to zero, the polarity indications of the polarity detecting means constituting a digital output signal.

2. An analog to digital converter according to claim 1, wherein said step variable signal supply means comprises a plurality of current paths, connecting means for connecting selected ones of said current paths in parallel, said connecting means comprising a respective gate for each current path and a respective binary storage element for each gate, said step variable signal comprising the sum of the currents carried by said current paths, and a resistor-capacitor circuit connected to the most significant one of said binary storage elements so that the capacitor voltage is representative of the average value of the most significant digit taken over a large number of encoding operations, the capacitor being connected to control said variable impedance means.

References Cited

UNITED STATES PATENTS

| | | | |
|---|---|---|---|
| 3,016,528 | 1/1962 | Villars | 340—347 |
| 3,204,187 | 9/1965 | Yashin | 328—48 XR |
| 3,221,324 | 11/1965 | Margopoulos | 340—347 |
| 3,225,347 | 12/1965 | Doyle | 340—347 |

MAYNARD R. WILBUR, *Primary Examiner.*

M. K. WOLENSKY, *Assistant Examiner.*

U.S. Cl. X.R.

330—86